US012777758B2

(12) United States Patent
Kim et al.

(10) Patent No.: US 12,777,758 B2
(45) Date of Patent: Oct. 27, 2026

(54) CRYSTALLIZED METAL CHALCOGENIDE THIN FILM HAVING A LAYERED STRUCTURE, THIN-FILM TRANSISTOR INCLUDING THE SAME, AND METHOD OF MANUFACTURING THE THIN-FILM TRANSISTOR

(71) Applicants: Samsung Display Co., Ltd., Yongin-si (KR); Postech Research And Business Development Foundation, Pohang-si (KR)

(72) Inventors: Hyungjun Kim, Yongin-si (KR); Yongyoung Noh, Pohang-si (KR); Junhyung Lim, Yongin-si (KR); Ao Liu, Pohang-si (KR)

(73) Assignees: Samsung Display Co., Ltd., Yongin-si (KR); Postech Research And Business Development Foundation, Pohang-si (KR)

( * ) Notice: Subject to any disclaimer, the term of this patent is extended or adjusted under 35 U.S.C. 154(b) by 590 days.

(21) Appl. No.: 18/364,399

(22) Filed: Aug. 2, 2023

(65) Prior Publication Data

US 2024/0128421 A1 Apr. 18, 2024

(30) Foreign Application Priority Data

Oct. 18, 2022 (KR) ........................ 10-2022-0134460

(51) Int. Cl.

| | |
|---|---|
| ***H10H 20/857*** | (2025.01) |
| ***H10D 30/01*** | (2025.01) |
| ***H10D 30/67*** | (2025.01) |
| ***H10D 62/40*** | (2025.01) |
| ***H10D 62/84*** | (2025.01) |
| ***H10H 20/01*** | (2025.01) |
| ***H10W 90/00*** | (2026.01) |

(52) U.S. Cl.

CPC ........ *H10H 20/857* (2025.01); *H10D 30/031* (2025.01); *H10D 30/6729* (2025.01); (Continued)

(58) Field of Classification Search

CPC ............. H10H 20/857; H10H 20/0364; H10D 30/031; H10D 30/6729; H10D 30/6757; (Continued)

(56) References Cited

U.S. PATENT DOCUMENTS

| | | | |
|---|---|---|---|
| 7,494,841 | B2 | 2/2009 | Mitzi et al. |
| 2005/0009225 | A1 | 1/2005 | Mitzi et al. |

(Continued)

FOREIGN PATENT DOCUMENTS

| | | | |
|---|---|---|---|
| KR | 20050007120 | A | 1/2005 |
| KR | 20130126949 | A | 11/2013 |

(Continued)

OTHER PUBLICATIONS

Korean Intellectual Property Office (KIPO) Office Action of Feb. 24, 2026 on Korean Application No. 10-2022-0134460.*

*Primary Examiner* — Rafael Pérez-Gutiérrez

(74) *Attorney, Agent, or Firm* — Womble Bond Dickinson (US) LLP

(57) ABSTRACT

A display device includes: a substrate; a thin-film transistor on the substrate; and a light-emitting diode electrically connected to the thin-film transistor, wherein the thin-film transistor includes: a semiconductor layer in which a source region, a drain region, and a channel region are defined; a gate electrode insulated from the semiconductor layer and overlapping the semiconductor layer; a source electrode electrically connected to the source region; and a drain electrode electrically connected to the drain region, wherein the semiconductor layer includes a crystallized metal chalcogenide including a transition metal and a chalcogen element and has a layered structure.

22 Claims, 19 Drawing Sheets

(52) U.S. Cl.
CPC ....... *H10D 30/6757* (2025.01); *H10D 62/402* (2025.01); *H10D 62/84* (2025.01); *H10W 90/00* (2026.01); *H10H 20/0364* (2025.01)

(58) Field of Classification Search
CPC ...... H10D 62/402; H10D 62/84; H10D 30/67; H10D 30/6755; H10D 62/80; H10D 86/021; H10D 86/60; H10D 99/00; H10D 86/423; H10W 90/00; G09F 9/335; H10K 59/12; H10K 59/1201; H10K 59/1213; H10K 71/00
See application file for complete search history.

(56) References Cited

U.S. PATENT DOCUMENTS

| | | | | |
|---|---|---|---|---|
| 2012/0104325 | A1* | 5/2012 | Talapin | C01B 19/002 423/511 |
| 2012/0138887 | A1 | 6/2012 | Zhang et al. | |
| 2014/0264320 | A1* | 9/2014 | Liang | H10D 86/423 257/43 |
| 2016/0035568 | A1* | 2/2016 | Chung | H10P 14/3436 438/478 |
| 2016/0049536 | A1* | 2/2016 | Kim | H10F 77/14 257/14 |
| 2020/0357635 | A1* | 11/2020 | Xu | C30B 29/46 |
| 2020/0373414 | A1* | 11/2020 | Yoon | H10D 30/031 |
| 2022/0100042 | A1* | 3/2022 | Zhang | G02F 1/133562 |
| 2023/0200146 | A1* | 6/2023 | Kim | H10K 50/813 257/40 |

FOREIGN PATENT DOCUMENTS

| | | | | | |
|---|---|---|---|---|---|
| KR | 20180074857 | A | | 7/2018 | |
| KR | 10-2119409 | B1 | | 6/2020 | |
| KR | 10-2301846 | B1 | | 9/2021 | |
| KR | 20220120274 | A | * | 8/2022 | B01J 27/051 |
| KR | 10-2023-0098452 | A | | 7/2023 | |

* cited by examiner (a-1) (a-2) (a-3)

(a) Hall mobility of transistor in dry air
(b) Hall mobility of transistor in humid air
(c) Electron concentration of transistor in dry air
(d) Electron concentration of transistor in humid air

CRYSTALLIZED METAL CHALCOGENIDE THIN FILM HAVING A LAYERED STRUCTURE, THIN-FILM TRANSISTOR INCLUDING THE SAME, AND METHOD OF MANUFACTURING THE THIN-FILM TRANSISTOR

CROSS-REFERENCE TO RELATED APPLICATION

This application claims priority to and the benefit of Korean Patent Application No. 10-2022-0134460, filed on Oct. 18, 2022, in the Korean Intellectual Property Office, the entire disclosure of which is hereby incorporated by reference.

BACKGROUND

1. Field

One or more embodiments of the present disclosure relate to a metal chalcogenide thin film, a thin-film transistor including the same, and a method of manufacturing the thin-film transistor.

2. Description of the Related Art

Display devices visually display data. Display devices may each include a substrate partitioned into a display area and a peripheral area. The display area may include scan lines and data lines insulated from each other, and may include a plurality of pixels. Also, a thin-film transistor corresponding to each of the pixels and a subpixel electrode electrically connected to the thin-film transistor may be provided in the display area. In addition, an opposite electrode commonly provided to the pixels may be provided in the display area. A scan driver, a data driver, a controller, a pad portion, various suitable wires, and/or the like may be provided in the peripheral area to transmit electrical signals to the display area.

The use of such display devices is diversifying. Accordingly, one or more suitable attempts have been made to design improvements to the quality of display devices. In addition, as the thicknesses of display devices are thin and the weights thereof are light, the range of their use is widening.

In order to improve the image quality of display devices, improving the performance of the thin-film transistors inside the display devices is also an important factor. Therefore, research on film quality improvement is continuing to improve the performance of thin-film transistors.

SUMMARY

Aspects of one or more embodiments of the present disclosure are directed toward a thin-film transistor with improved performance, a display device including the thin-film transistor, and a method of manufacturing the thin-film transistor. However, the embodiments are examples, and the scope of the present disclosure is not limited thereby.

Additional aspects will be set forth in part in the description which follows and, in part, will be apparent from the description, or may be learned by practice of the presented embodiments of the disclosure.

According to one or more embodiments of the present disclosure, a display device includes a substrate, a thin-film transistor on the substrate, and a light-emitting diode electrically connected to the thin-film transistor, wherein the thin-film transistor includes a semiconductor layer in which a source region, a drain region, and a channel region are defined, a gate electrode insulated from the semiconductor layer and overlapping the semiconductor layer, a source electrode electrically connected to the source region, and a drain electrode electrically connected to the drain region, wherein the semiconductor layer includes a crystallized metal chalcogenide including a transition metal and a chalcogen element and has a layered structure.

In one or more embodiments, the transition metal may include at least one of (e.g., one selected from) bismuth (Bi), tin (Sn), niobium (Nb), tantalum (Ta), molybdenum (Mo), tungsten (W), hafnium (Hf), titanium (Ti), and/or rhenium (Re), and the chalcogen element may include at least one of (e.g., one selected from) sulfur (S), selenium (Se), and/or tellurium (Te).

In one or more embodiments, the semiconductor layer may include bismuth sulfide ($Bi_2S_3$).

In one or more embodiments, the layered structure of the semiconductor layer may have a structure in which a first sub-layer and a second sub-layer are alternately stacked.

In one or more embodiments, the transition metal of the crystallized metal chalcogenide may be arranged in the first sub-layer, and the chalcogen element of the crystallized metal chalcogenide may be arranged in the second sub-layer.

In one or more embodiments, in the crystallized metal chalcogenide, a main peak obtained by an X-ray diffraction (XRD) spectrum may appear in a region where a diffraction angle 2θ is about 15° to about 16°, and a sub-peak obtained by the X-ray diffraction (XRD) spectrum may appear in a region where the diffraction angle 2θ is about 25° to about 26°.

In one or more embodiments, the semiconductor layer may have a thickness of about 10 nm to about 50 nm.

In one or more embodiments, electron mobility of the thin-film transistor including the semiconductor layer may have a value of 10 $cm^2V^{-1}s^{-1}$ to 14 $cm^2V^{-1}s^{-1}$.

In one or more embodiments, an on-to-off current ratio ($I_{on}/I_{off}$) of the thin-film transistor including the semiconductor layer may have a value of about $10^4$ to about $10^9$.

In one or more embodiments, the semiconductor layer may have a band gap of about 1.4 eV to about 1.6 eV.

In one or more embodiments, the semiconductor layer may have a surface roughness of about 0.23 nm to about 0.25 nm.

According to one or more embodiments of the present disclosure, a method of manufacturing a display device includes forming a thin-film transistor on a substrate, and forming a light-emitting diode electrically connected to the thin-film transistor, wherein the forming of the thin-film transistor includes forming a semiconductor layer in which a source region, a drain region, and a channel region are defined, forming a gate electrode insulated from the semiconductor layer and overlapping the semiconductor layer, forming a source electrode electrically connected to the source region, and forming a drain electrode electrically connected to the drain region, wherein the forming of the semiconductor layer includes depositing a semiconductor precursor including a metal chalcogenide, which includes a transition metal and a chalcogen element, and crystallizing the semiconductor precursor to have a layered structure.

In one or more embodiments, the metal chalcogenide may be a compound of a transition metal and a chalcogen element, wherein the transition metal may include at least one of (e.g., one selected from) bismuth (Bi), tin (Sn), niobium (Nb), tantalum (Ta), molybdenum (Mo), tungsten (W), hafnium (Hf), titanium (Ti), and/or rhenium (Re), and the chalcogen element may include at least one of (e.g., selected from) sulfur (S), selenium (Se), and/or tellurium (Te).

In one or more embodiments, the semiconductor layer having the layered structure may include bismuth sulfide $Bi_2S_3$.

In one or more embodiments, the depositing of the semiconductor precursor may be performed through a thermal deposition process.

In one or more embodiments, the thermal deposition process may include providing a thermal deposition source and the substrate into a vacuum chamber, heating the thermal deposition source, and evaporating a material included in the thermal deposition source in an atomic or molecular state and depositing the material on a surface of the substrate to coat the surface of the substrate with a thin film.

In one or more embodiments, the thermal deposition source may include Bi metal and $Bi_2S_3$ powder.

In one or more embodiments, in the thermal deposition process, an inside of the vacuum chamber may be heated to about 150° C. to about 450° C. and then maintained.

In one or more embodiments, the semiconductor layer may have a thickness of about 10 nm to about 50 nm.

In one or more embodiments, the crystallizing of the semiconductor precursor may be performed through a heat treatment process.

In one or more embodiments, the heat treatment process may include applying heat of about 200° C. to about 300° C. for about 30 minutes to about 1 hour.

In one or more embodiments, through the crystallizing of the semiconductor precursor, electron mobility of the thin-film transistor may have a value of 10 $cm^2V^{-1}s^{-1}$ to 14 $cm^2V^{-1}s^{-1}$.

In one or more embodiments, through the crystallizing of the semiconductor precursor, an on-to-off current ratio of the thin-film transistor may have a value of about $10^4$ to about $10^9$.

BRIEF DESCRIPTION OF THE DRAWINGS

The above and other aspects, features, and/or principles of certain embodiments of the present disclosure will be more apparent from the following description taken in conjunction with the accompanying drawings, in which.

DETAILED DESCRIPTION

Figure 1:
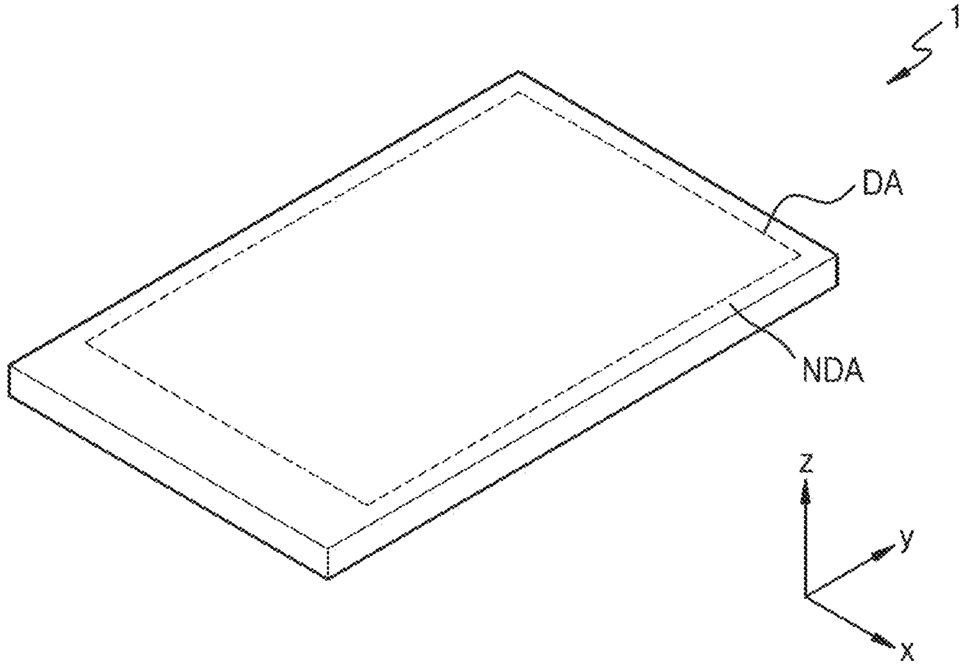
FIG. 1 is a schematic perspective view of a display device according to one or more embodiments of the present disclosure.

The present disclosure may be modified in many alternate forms, and thus specific embodiments will be exemplified in the drawings and described in more detail. It should be understood, however, that it is not intended to limit the present disclosure to the particular forms disclosed, but rather, is intended to cover all modifications, equivalents, and alternatives falling within the spirit and scope of the present disclosure. Embodiments of the present disclosure are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described.

Unless otherwise noted, like reference numerals denote like elements throughout the attached drawings and the written description, and thus, descriptions thereof may not be repeated. In the drawings, the relative sizes of elements, layers, and regions may be exaggerated for clarity.

As used herein, the term "and/or" includes any and all combinations of one or more of the associated listed items. Expressions such as "at least one of," "a plurality of," "one of," and other prepositional phrases, when preceding a list of elements, should be understood as including the disjunctive if written as a conjunctive list and vice versa. For example, the expressions "at least one of a, b, or c," "at least one of a, b, and/or c," "one selected from the group consisting of a, b, and c," "at least one selected from a, b, and c," "at least one from among a, b, and c," "one from among a, b, and c", "at least one of a to c" indicates only a, only b, only c, both a and b, both a and c, both b and c, all of a, b, and c, or variations thereof.

The present disclosure may include one or more suitable embodiments and modifications, and embodiments thereof will be illustrated in the drawings and will be described herein in more detail. The effects and features of the disclosure and the accompanying methods thereof will become apparent from the following description of the embodiments, taken in conjunction with the accompanying drawings. However, the disclosure is not limited to the embodiments described below, and may be embodied in one or more suitable modes.

Hereinafter, the present disclosure will be described in more detail by explaining embodiments of the disclosure with reference to the attached drawings. Like reference numerals in the drawings denote like elements, and redundant explanations may be omitted.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

As used herein, the singular forms "a," "an," and "the" are intended to include the plural forms as well, unless the context clearly indicates otherwise.

It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof.

It will be further understood that a layer, region, or element that is "formed on" or "on" another layer, area, or element may be directly or indirectly formed on or on the other layer, region, or element. That is, for example, intervening layers, regions, or elements may be present therebetween.

Sizes of elements in the drawings may be exaggerated or contracted for convenience of explanation. In other words, because sizes and thicknesses of elements in the drawings may be arbitrarily illustrated for convenience of explanation, the following embodiments are not limited thereto.

When embodiments may be implemented differently, a process order may be performed differently from the described order. For example, two consecutively described processes may be performed substantially at the same time or performed in an order opposite to the described order.

It will be understood that when a layer, region, or element is referred to as being "connected," the layer, the region, or the element may be directly connected or may be indirectly connected with intervening layers, regions, or elements therebetween. For example, when a layer, region, or element is referred to as being "electrically connected to" or "electrically coupled to" another layer, region, or element, it may be directly or indirectly electrically connected or coupled to the other layer, region, or element. That is, for example, intervening layers, regions, or elements may be present therebetween. In addition, it will also be understood that when an element or layer is referred to as being "between" two elements or layers, it can be the only element or layer between the two elements or layers, or one or more intervening elements or layers may also be present.

Spatially relative terms, such as "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

FIG. 1 is a schematic perspective view of a display device 1 according to one or more embodiments of the present embodiment.

Referring to FIG. 1, the display device 1 includes a display area DA and a non-display area NDA outside the display area DA. Various display elements, such as organic light-emitting diodes (OLEDs), may be disposed in the display area DA. Various lines may be positioned in the non-display area NDA to transmit electrical signals to be applied to the display area DA including the thin-film transistor. Although one thin-film transistor may be disposed in the non-display area NDA, a plurality of thin-film transistors and capacitors may be further included, and wires, such as scan lines, data lines, and power lines connected to the thin-film transistors and capacitors, may be further provided.

FIG. 1 illustrates a display device 1 having a rectangular display area DA. However, the present disclosure is not limited thereto. The shape of the display area DA may be a circle, an ellipse, or a polygon, such as a triangle or a pentagon.

In one or more embodiments, although the display device 1 of FIG. 1 shows a flat panel display device, the display device 1 may be implemented in one or more suitable forms, such as a flexible display device, a foldable display device, and a rollable display device.

Hereinafter, for convenience, an organic light-emitting display device will be described as an example of the display device 1 according to one or more embodiments. However, the display device 1 of the disclosure is not limited thereto. In one or more embodiments, one or more suitable types (kinds) of display device, such as an inorganic light-emitting display and a quantum dot light-emitting display, may be utilized.

Figure 2:
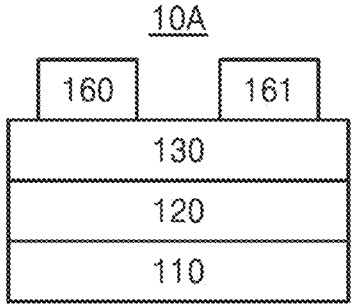
FIG. 2 is a schematic view illustrating a thin-film transistor according to one or more embodiments of the present disclosure.

FIG. 2 is a schematic view illustrating a thin-film transistor 10A according to one or more embodiments of the present disclosure.

Referring to FIG. 2, the thin-film transistor 10A includes a gate electrode 110, a gate insulating layer 120 in contact with the gate electrode 110, a semiconductor layer 130 insulated from the gate electrode 110 by the gate insulating layer 120, and a source electrode 160 and a drain electrode 161 in contact with the semiconductor layer 130.

The gate electrode 110 may include a metal material having good or suitable conductivity, and may include a single layer or multiple layers including aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), or a combination thereof. For example, the gate electrode 110 may include Au, Ag, Cu, Ni, Pt, Pd, Al, Mo, or an alloy, such as an Al:Nd or Mo:W alloy. However, these are examples and the present disclosure is not limited thereto and may be implemented by utilizing one or more suitable materials.

Figure 3:
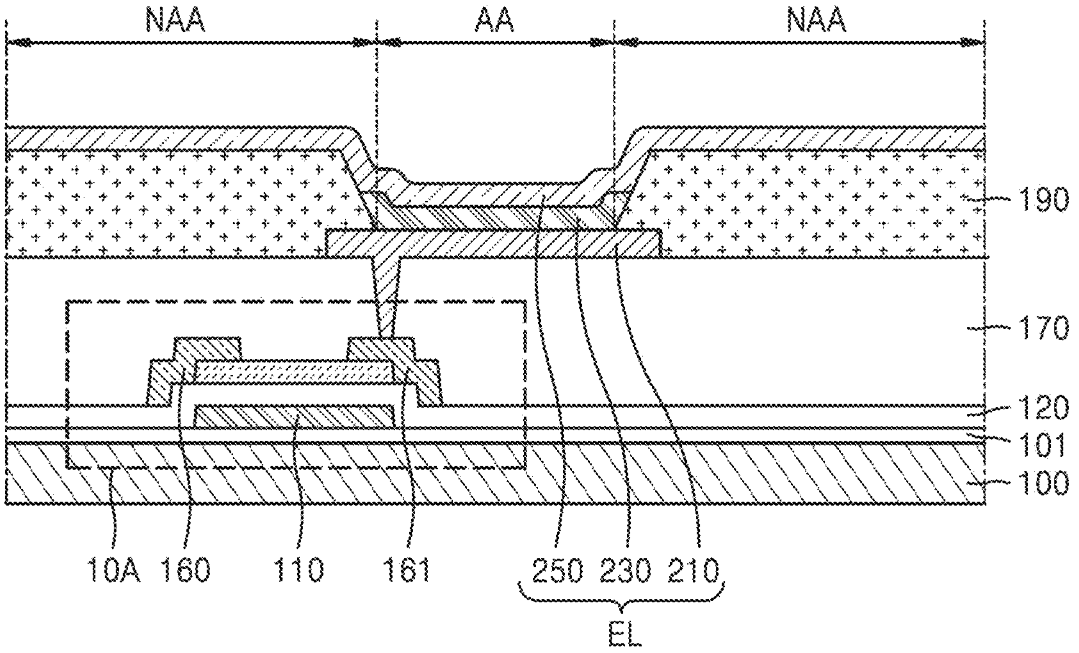
FIG. 3 is a schematic cross-sectional view illustrating a configuration of a display device according to one or more embodiments of the present disclosure.

The gate electrode 110 may be disposed on a substrate (see, e.g., FIG. 3).

The gate insulating layer 120 may be disposed on the gate electrode 110. In this case, the gate insulating layer 120 may be formed utilizing one or more suitable insulating materials, for example, an oxide or nitride. The gate insulating layer 120 insulates the gate electrode 110 from the semiconductor layer 130.

The gate insulating layer 120 may include silicon oxide, silicon nitride, silicon oxynitride, and/or aluminum oxide.

The semiconductor layer 130 may be formed or disposed on the gate insulating layer 120. The semiconductor layer 130 may include a metal chalcogenide. The metal chalcogenide is a compound of a transition metal and a chalcogen element. The transition metal may include at least one of (e.g., one selected from) bismuth (Bi), tin (Sn), niobium (Nb), tantalum (Ta), molybdenum (Mo), tungsten (W), hafnium (Hf), titanium (Ti), and/or rhenium (Re), and the chalcogen element may include at least one of (e.g., one selected from) sulfur (S), selenium (Se), and/or tellurium (Te). In one or more embodiments, the semiconductor layer 130 may include bismuth sulfide ($Bi_2S_3$).

The semiconductor layer 130 may include a crystallized metal chalcogenide. For example, the metal chalcogenide included in the semiconductor layer 130 may be formed or deposited in an amorphous state, but may be converted into a crystalline state through a crystallization operation. For example, bismuth sulfide ($Bi_2S_3$) may have a layer structure through a layer crystallization process. In one or more embodiments, the semiconductor layer 130 may be formed or deposited through a thermal deposition process, and the metal chalcogenide included in the formed or deposited semiconductor layer 130 may be crystallized through a subsequent heat treatment process. The deposition and crystallization operations of the semiconductor layer 130 will be described in more detail with reference to FIGS. 4 to 5B.

The source electrode 160 and the drain electrode 161 may be disposed on the semiconductor layer 130. The source electrode 160 and the drain electrode 161 may be disposed to contact the semiconductor layer 130. The source electrode 160 and the drain electrode 161 may each include a single layer or multiple layers including Al, Pt, Pd, Ag, Mg, Au, Ni, Nd, Ir, Cr, Li, Ca, Mo, Ti, W, Cu, or a combination thereof. For example, the source electrode 160 and the drain electrode 161 may each have a triple-layered structure including Mo/Al/Mo, Mo/Al/Ti, or Ti/Al/Ti layers.

FIG. 3 is a schematic cross-sectional view illustrating a configuration of a display device according to one or more embodiments of the present disclosure.

Referring to FIG. 3, the display device 1 according to one or more embodiments may include a substrate 100, a light-emitting element EL, and the thin-film transistor 10A described above.

The substrate 100 may include one or more suitable materials, such as glass, metal, metal oxide, metal nitride, or plastic. For example, the substrate 100 may include polyethersulfone, polyacrylate, polyetherimide, polyethylenenaphthalate, polyethyleneterepthalate, polyphenylene sulfide, polyarylate, polyimide, polycarbonate, cellulose acetate propionate, and/or the like.

The substrate 100 may include a glass material containing $SiO_2$ as a main component. The substrate 100 is not necessarily limited thereto and may include a plastic material. In this case, the plastic material forming the substrate 100 may be one or more of (e.g., one or more selected from) one or more suitable organic materials. Also, in one or more embodiments, the substrate 100 may include a metal thin film. The substrate 100 may be flexible, rollable, or bendable. The substrate 100 may have a multi-layered structure, and multiple layers thereof may include different materials.

A buffer layer 101 may be disposed on the substrate 100. The buffer layer 101 may prevent or reduce penetration of impurities through the substrate 100 and provide a flat surface on the substrate 100. The buffer layer 101 may include an inorganic insulator, such as silicon nitride, silicon oxynitride, and silicon oxide, and may have a single layer or multiple layers including the aforementioned inorganic insulator.

The thin-film transistor 10A described above may be disposed on the buffer layer 101.

One of the source electrode 160 or the drain electrode 161 of the thin-film transistor 10A may be electrically connected to a first electrode 210 of the light-emitting element EL, and as shown in FIG. 3, according to one or more embodiments, the first electrode 210 of the light-emitting element may be connected to the drain electrode 161.

A passivation layer 170 may be formed to cover the source electrode 160 and the drain electrode 161. The passivation layer 170 may include an inorganic insulating layer, an organic insulating layer, or a combination thereof. The first electrode 210 may be disposed on the passivation layer 170. The passivation layer 170 may be disposed to expose a certain region without entirely covering the drain electrode 161, and the first electrode 210 may be disposed to be connected to the exposed drain electrode 161. In one or more embodiments, the passivation layer 170 may not be provided.

A bank layer 190 including an insulating material may be disposed on the first electrode 210. The bank layer 190 may expose a certain region of the first electrode 210, and an intermediate layer 230 may be formed in the exposed region. The bank layer 190 may be a polyimide or polyacrylic organic layer. In one or more embodiments, some layers in the intermediate layer 230 may extend to the top of the bank layer 190 and be disposed in the form of a common layer.

The light-emitting element EL may include the first electrode 210, a second electrode 250 facing the first electrode 210, and an intermediate layer 230 disposed between the first electrode 210 and the second electrode 250.

When the light-emitting element EL is a top light-emitting element, the first electrode 210 may be formed as a reflective electrode. The reflective electrode may include a reflective layer including Ag, Mg, Al, Pt, Pd, Au, Ni, Nd, Ir, Cr, or a compound thereof, and a transparent or translucent electrode layer formed on the reflective layer.

When the light-emitting element EL is a bottom light-emitting element, the first electrode 210 may include a transparent material, such as ITO, IZO, ZnO, or $In_2O_3$, and may include a transparent or translucent electrode.

The intermediate layer 230 may include an emission layer that emits light, and may further include at least one (i.e. at least one functional layer) of a hole transport region (a hole injection layer (HIL) and/or a hole transport layer (HTL)) and/or an electron transport region (an electron transport layer (ETL) and/or an electron injection layer (EIL)). However, the present disclosure is not limited thereto, and one or more suitable functional layers may be further disposed on the first electrode 210.

The emission layer may be a red emission layer, a green emission layer, or a blue emission layer. In one or more embodiments, the emission layer may have a multi-layered structure in which a red emission layer, a green emission layer, and a blue emission layer are stacked to emit white light, or may have a single-layered structure including a red emission material, a green emission material, and a blue emission material.

The second electrode 250 may be provided on the intermediate layer 230. The second electrode 250 may be a reflective electrode, a transparent electrode, or a translucent electrode. For example, the second electrode 250 may include a metal having a low work function, and may include Li, Ca, LiF/Ca, LiF/Al, Al, Ag, Mg, or a combination thereof.

In one or more embodiments, the display apparatus 1 may further include an opposite substrate on the second electrode 250. For a description of the opposite substrate, refer to the description of the substrate 100.

In one or more embodiments, a black matrix (BM) and a color filter (CF) may be disposed on a surface of the opposite substrate facing the substrate 100. The color filter CF may be disposed to correspond to an emission area AA of the display device 1. The black matrix BM may be disposed to correspond to an area other than the emission area AA of the display device 1.

In one or more embodiments, a protective layer may be further disposed between the opposite substrate and the second electrode 250. The protective layer may include a single layer or multiple layers of an inorganic layer and/or an organic layer.

In one or more embodiments, one or more suitable functional layers may be further provided on the opposite substrate. For example, the functional layer may be an antireflection layer that reduces reflection on the upper surface of the opposite substrate, or an antifouling layer that prevents contamination, such as by a user's handprint (e.g., a fingerprint mark).

According to one or more embodiments, a thin-film encapsulation layer may be disposed above the substrate 100 instead of the opposite substrate. The thin-film encapsulation layer may include an inorganic encapsulation layer including at least one inorganic material and an organic encapsulation layer including at least one organic material. In one or more embodiments, the thin-film encapsulation layer may have a structure in which a first inorganic encapsulation layer, an organic encapsulation layer, and a second inorganic encapsulation layer are stacked.

Figure 4:
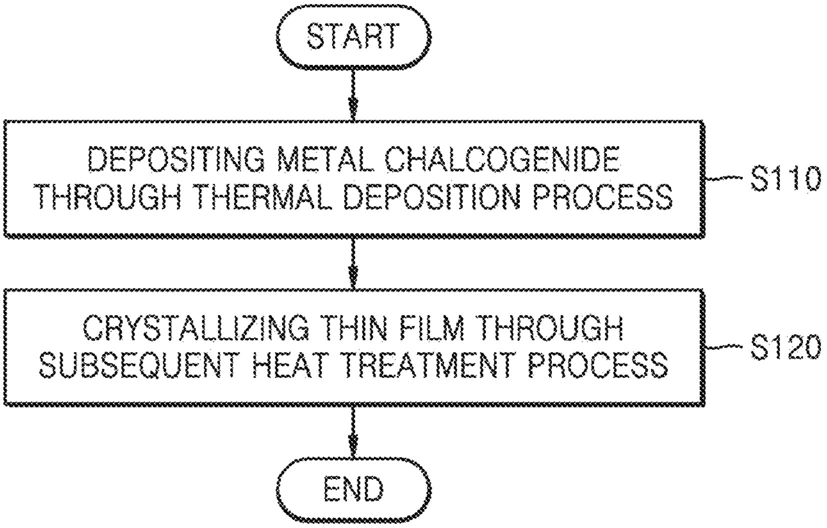
FIG. 4 is a flowchart of a method of manufacturing a semiconductor layer of a display device, according to one or more embodiments of the present disclosure.
Figure 5A:
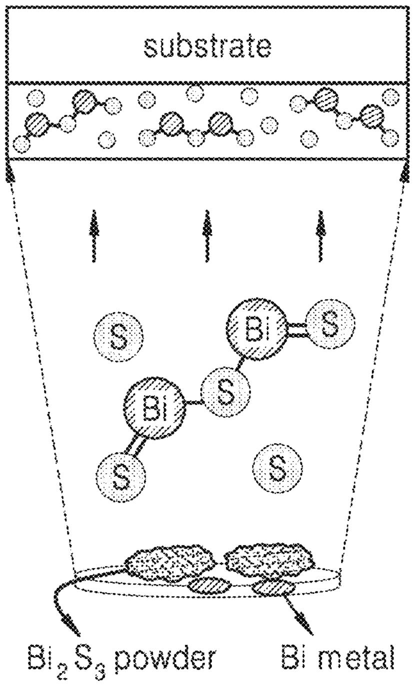
FIGS. 5A and 5B are schematic views illustrating a process of manufacturing a semiconductor layer of a display device, according to one or more embodiments of the present disclosure.
Figure 5B:
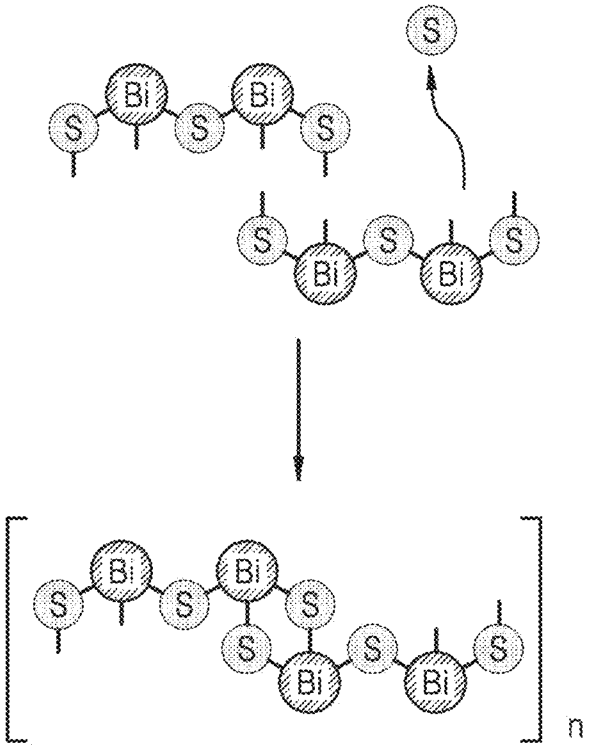

FIG. 4 is a flowchart of a method of manufacturing a semiconductor layer of a display device, according to one or more embodiments of the present disclosure, and FIGS. 5A and 5B are schematic views illustrating a process of manufacturing a semiconductor layer of a display device, according to one or more embodiments of the present disclosure.

Referring to FIG. 4, the method of manufacturing the semiconductor layer 130 (see FIG. 3) of the display device 1, according to one or more embodiments, includes depositing a metal chalcogenide through a thermal deposition process (S110), and crystallizing a thin film through a subsequent heat treatment process (S120).

First, in order to form the semiconductor layer 130, a metal chalcogenide may be deposited on a substrate through a thermal deposition process (S110). The thermal deposition process is a deposition method in which thermal energy is applied to a thermal deposition source to be deposited and the thermal deposition source is vaporized while evaporating and being deposited on a substrate. The vaporized thermal deposition source has kinetic energy and goes straight to the substrate, and a thin film may be formed on the surface of the substrate as source atoms are condensed on the surface of the substrate having a lower temperature than that of the vaporized thermal deposition source.

As described above, the metal chalcogenide is a compound of a transition metal and a chalcogen element, and the transition metal may include at least one of (e.g., one selected from) Bi, Sn, Nb, Ta, Mo, W, Hf, Ti, and/or Re and the chalcogen element may include at least one of (e.g., one selected from) S, Se, and/or Te. In one or more embodiments, the semiconductor layer 130 may be formed by depositing bismuth sulfide $Bi_2S_3$.

Next, a subsequent heat treatment process may be performed on the deposited semiconductor precursor of semiconductor layer 130 to thereby crystallize a deposited metal chalcogenide thin film (S120). In other words, by heating the metal chalcogenide thin film deposited through the thermal deposition process to a crystallization temperature or higher, the metal chalcogenide thin film may be converted from an amorphous state to a crystalline state.

For example, referring to FIG. 5A, the semiconductor layer 130 may be formed (e.g., a semiconductor precursor of the semiconductor layer 130 may be deposited) through a thermal deposition process. The thermal deposition process includes providing a thermal deposition source and a substrate into a vacuum chamber, heating the thermal deposition source, and evaporating a material included in the thermal deposition source into an atomic or molecular state and depositing the material on the surface of the substrate to coat the surface of the substrate with a thin film. In other words, because the metal chalcogenide obtains thermal energy through the thermal deposition process and the vaporized thermal deposition source irregularly reaches the surface of the substrate to form a thin film, the metal chalcogenide may be deposited on the surface of the substrate in an amorphous state.

In one or more embodiments, the thermal deposition source may include Bi metal and $Bi_2S_3$ powder. In such cases, by heating and maintaining the inside of the vacuum chamber at about 150° C. to about 450° C., Bi metal and $Bi_2S_3$ powder, which are thermal deposition sources, may be evaporated in an atomic or molecular state.

The degree of vacuum inside the vacuum chamber may be a high vacuum state of $3\times10^{-6}$ Torr in order to reduce the influence of external contamination and stably perform thermal deposition. The substrate provided into the vacuum chamber may be at room temperature. Bi and $Bi_2S_3$ in an atomic or molecular state may be deposited on the surface of the substrate provided on the opposite side of the thermal deposition source to coat the surface of the substrate with a thin film.

The deposited semiconductor precursor of the semiconductor layer 130 may be in an amorphous state. In other words, $Bi_2S_3$, which is a metal chalcogenide included in the semiconductor layer 130, may be in an amorphous state and molecules of $Bi_2S_3$ may be irregularly arranged with each other. In one or more embodiments, due to heat maintained in the vacuum chamber, a double bond connecting Bi and S to each other in the molecular structure of $Bi_2S_3$ may be decomposed, and S (e.g., some of the S) may be present separately from $Bi_2S_3$ in the semiconductor layer 130 that is in an amorphous state.

Referring to FIG. 5B, the deposited semiconductor precursor of the semiconductor layer 130 may be crystallized through a subsequent heat treatment process. When a metal chalcogenide thin film deposited in an amorphous state is subjected to subsequent heat treatment at a temperature equal to or higher than a crystallization temperature, the metal chalcogenide thin film may be converted into a crystalline state. When the metal chalcogenide thin film is converted into a crystalline state, molecules or atoms included in the thin film may be regularly arranged to have a lattice property. In other words, the metal chalcogenide thin film may have a layered structure when converted into a crystalline state. The subsequent heat treatment process may be performed by applying heat of about 200° C. to about 300° C. for about 30 minutes to about 1 hour.

In one or more embodiments, when heat of about 200° C. to about 300° C. is applied, for 1 hour, to $Bi_2S_3$ deposited in an amorphous state, the deposited $Bi_2S_3$ may be converted into a crystalline state. For example, when the heat treatment process is performed at a temperature equal to or higher than the crystallization temperature, S atoms separately present between $Bi_2S_3$ in the amorphous state may be released. In one or more embodiments, the irregularly arranged $Bi_2S_3$ molecules may combine with each other to form a regularly arranged layered structure.

The metal chalcogenide thin film may secure or provide semiconductor properties when converted from an amorphous state to a crystalline state. When the metal chalcogenide thin film is in an amorphous state, the metal chalcogenide thin film has characteristics as a metal layer because molecules are irregularly arranged. However, as the crystallinity of the metal chalcogenide thin film increases, the metal chalcogenide thin film has characteristics as a semiconductor layer. In other words, the metal chalcogenide thin film having high crystallinity has excellent or suitable electron mobility and on-to-off current ratio characteristics, thereby improving electrical characteristics of the thin-film transistor.

In one or more embodiments, the heat treatment process has advantages in that it is easy to process large-area products, the process is simple, and the cost is low. When the crystallization of $Bi_2S_3$ is performed through the heat treatment process, $Bi_2S_3$ may be easily crystallized even when a semiconductor layer utilizing $Bi_2S_3$ is formed in a large area, and it is advantageous in terms of cost reduction.

Figure 6:
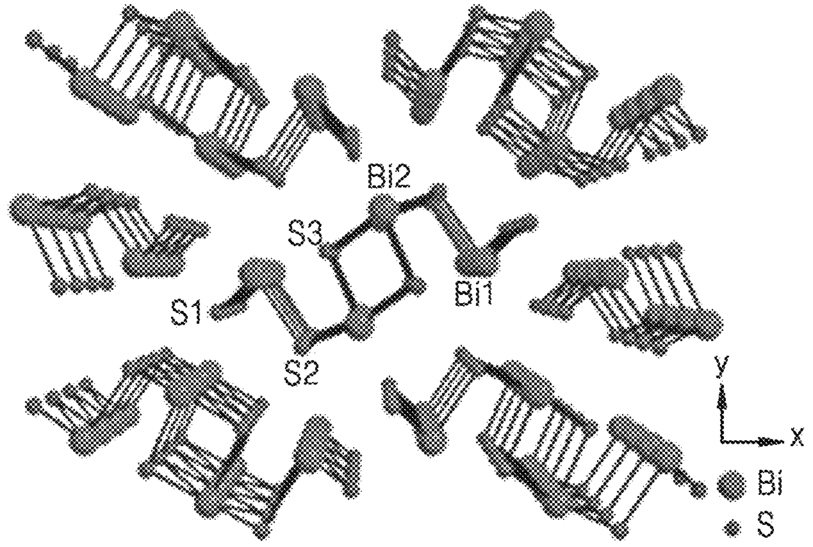
FIG. 6 is an image showing a crystallized structure of a semiconductor layer of a display device according to one or more embodiments of the present disclosure.
Figure 7:
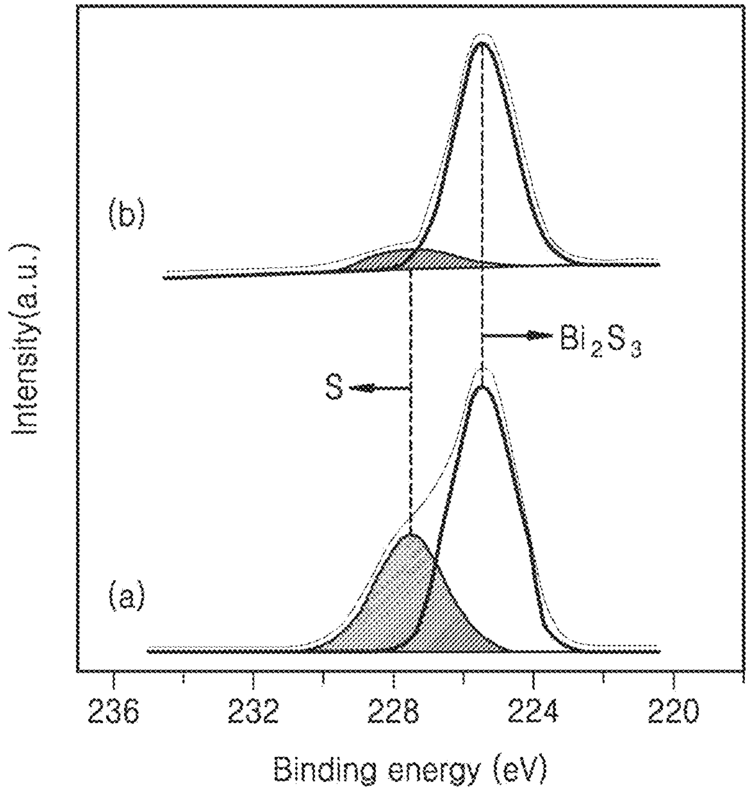
FIG. 7 is a graph showing an X-ray photoelectron spectroscopy (XPS) analysis result for a semiconductor layer of a display device according to one or more embodiments of the present disclosure.
Figure 8:
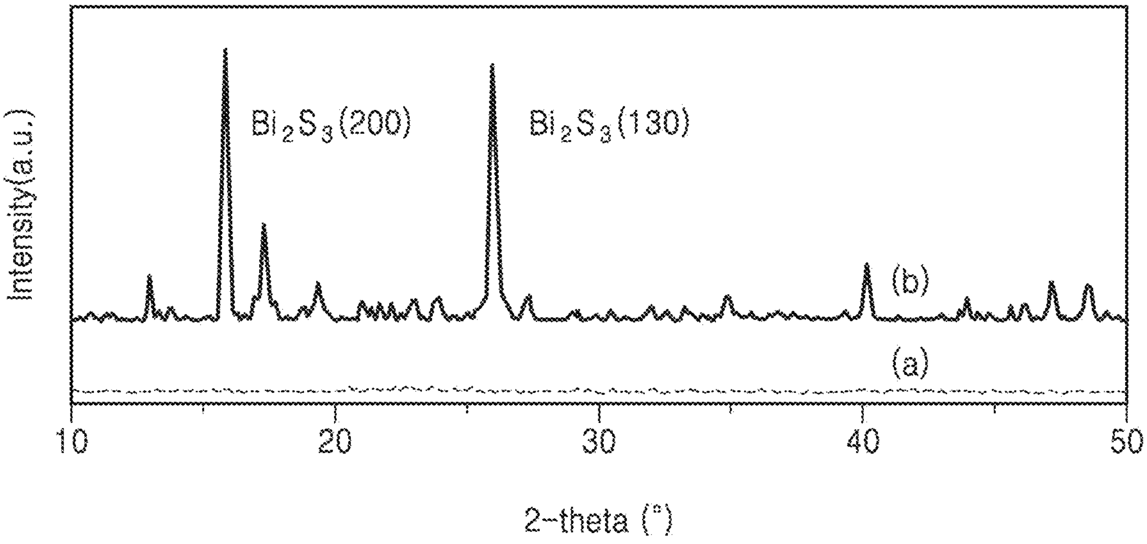
FIG. 8 is a graph showing an X-ray diffraction (XRD) analysis result for a semiconductor layer of a display device according to one or more embodiments of the present disclosure.
Figure 9A:
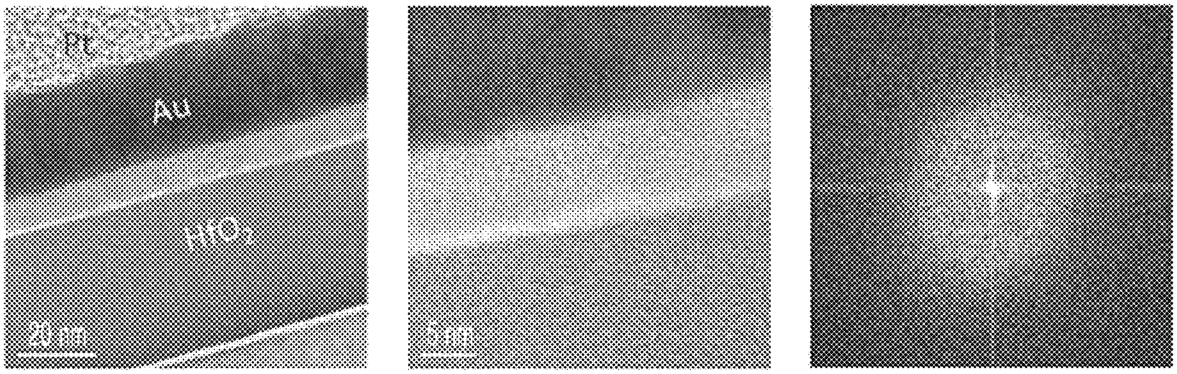
FIGS. 9A and 9B are each transmission electron microscope (TEM) images of a semiconductor layer of a display device according to one or more embodiments of the present disclosure.
Figure 9B:
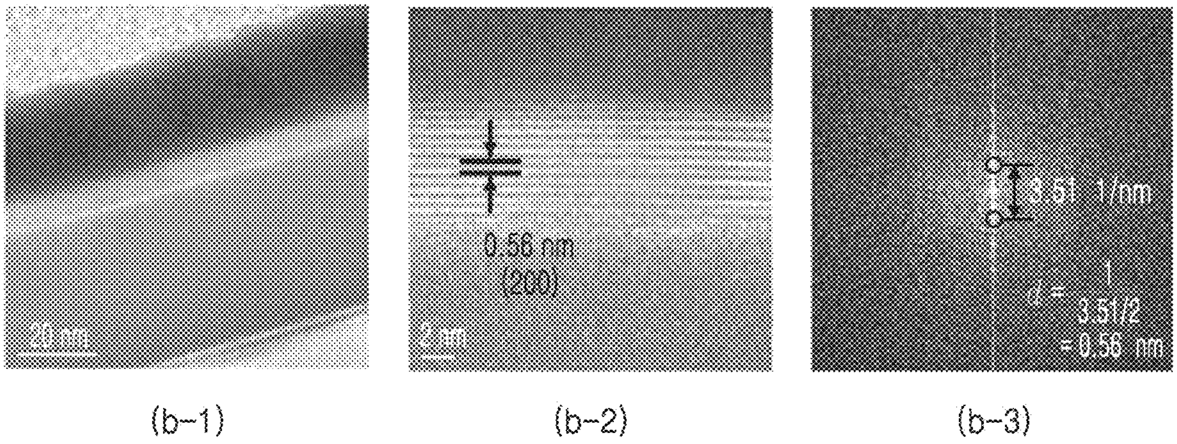
Figure 10:
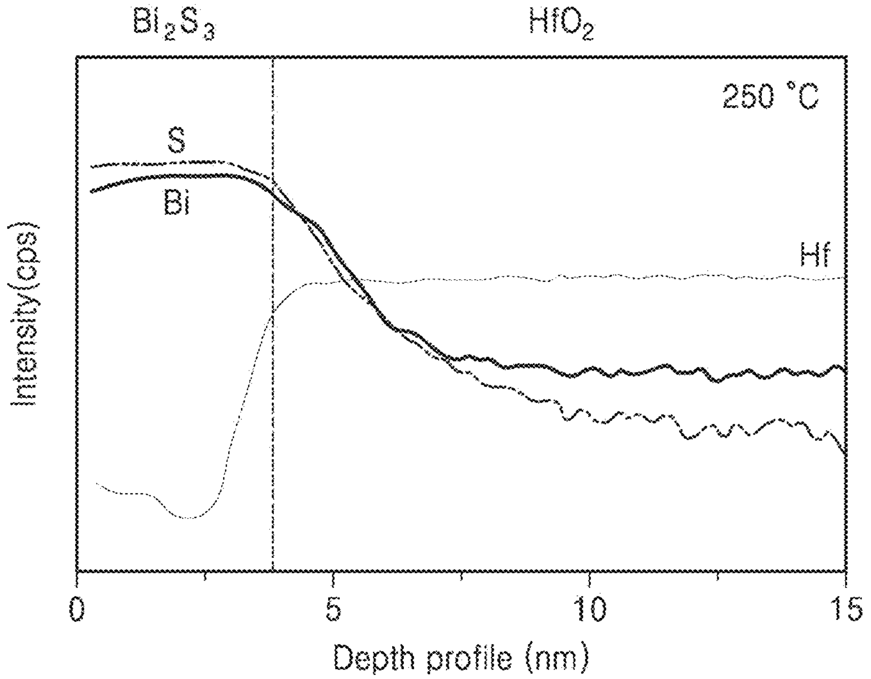
FIG. 10 is a graph showing a secondary ion mass spectrometer (SIMS) analysis result for a thin-film transistor according to one or more embodiments of the present disclosure.

FIG. 6 is an image showing a crystallized structure of a semiconductor layer of a display device according to one or more embodiments of the present disclosure, FIG. 7 is a graph showing an X-ray photoelectron spectroscopy (XPS) analysis result for a semiconductor layer of a display device according to one or more embodiments of the present disclosure, and FIG. 8 is a graph showing an X-ray diffraction (XRD) analysis result for a semiconductor layer of a display device according to one or more embodiments of the present disclosure. FIGS. 9A and 9B are transmission electron microscope (TEM) images of a semiconductor layer of a display device according to one or more embodiments of the present disclosure, and FIG. 10 is a graph showing a secondary ion mass spectrometer (SIMS) analysis result for a thin-film transistor according to one or more embodiments of the present disclosure.

As shown in FIG. 6, the crystallized $Bi_2S_3$ may be regularly arranged to form the semiconductor layer 130. For example, each of the $Bi_2S_3$ molecules may include a first bismuth atom Bi1, a second bismuth atom Bi2, a first sulfur atom S1, a second sulfur atom S2, and a third sulfur atom $S_3$. In the amorphous state, the $Bi_2S_3$ molecules may be irregularly arranged while being apart from each other. However, a second bismuth atom Bi2 of a $Bi_2S_3$ molecule crystallized through a heat treatment process may combine with a third sulfur atom $S_3$ of an adjacent $Bi_2S_3$ molecule to form a two-dimensional structure. In other words, the $Bi_2S_3$ molecules arranged adjacent to each other may combine with each other in the form of sharing two third sulfur atoms $S_3$. The $Bi_2S_3$ molecules crystallized through this structure may be regularly arranged to form a layered structure.

Next, FIG. 7 illustrates an XPS analysis result obtained before and after a heat treatment process for the semiconductor layer 130 deposited with $Bi_2S_3$. The content (e.g., amount) of a material to be measured may be checked by analyzing a binding energy measured utilizing XPS and performing qualitative and quantitative analysis by determining constituent elements constituting a sample. Through the XPS analysis result, it may be checked how the concentration of a material constituting the semiconductor layer 130 changes according to the progress of a subsequent heat treatment process. The X-axis of FIG. 7 represents binding energy, and the Y-axis of FIG. 7 represents signal intensity for a material having a certain binding energy.

Referring to FIG. 7, a graph (a) is an XPS analysis result for the semiconductor layer 130 not subjected to a heat treatment process, and a graph (b) is an XPS analysis result for the semiconductor layer 130 subjected to a heat treatment process. Specifically, a sample in the graph (a) is in an amorphous state because a subsequent heat treatment process was not performed after $Bi_2S_3$ was deposited, and a sample in the graph (b) is in a crystalline state because a subsequent heat treatment process was performed after $Bi_2S_3$ was deposited.

In both graphs (a) and (b), a main peak may be formed in a region having a binding energy of 225 eV, and a sub-peak may be formed in a region having a binding energy of 228 eV. A peak formed in the region having a binding energy of 225 eV may be attributed to bonding within a $Bi_2S_3$ molecule, and a peak formed in the region having a binding energy of 228 eV may be attributed to bonding between S atoms. In other words, the higher a peak value in the region having a binding energy of 225 eV, the higher the concentration of $Bi_2S_3$, and the higher a peak value in the region having a binding energy of 228 eV, the higher the concentration of S.

In this case, both graphs (a) and (b) may show high peak values in the region having a binding energy of 225 eV, but in the region having a binding energy of 228 eV, the graph (a) has a much higher peak value than the graph (b). In other words, there is no significant change in the concentration of $Bi_2S_3$ in the semiconductor layer 130 before and after the heat treatment process, but the concentration of S atoms in the semiconductor layer 130 after the heat treatment process is much less than the concentration of S atoms in the semiconductor layer 130 before the heat treatment process. This is because, as described above, in the process of crystallizing $Bi_2S_3$ through the heat treatment process, S atoms obtain thermal energy and are released.

Next, FIG. 8 illustrates an XRD analysis result obtained before and after a heat treatment process for the semiconductor layer 130 deposited with $Bi_2S_3$. The XRD analysis is to diffract X-rays to a desired or suitable sample to represent the internal information of the sample in a graph, and may check the molecular and crystal structure of a material by making high-energy X-rays incident thereon. The X-axis of FIG. 8 represents diffraction angle 2θ, and the Y-axis of FIG. 8 represents signal intensity for a material corresponding to a certain diffraction angle. Accordingly, when a peak appears at a unique angle, the crystal structure of the sample may be confirmed.

Referring to FIG. 8, a graph (a) is an XRD analysis result for the semiconductor layer 130 not subjected to a heat treatment process, and a graph (b) is an XRD analysis result for the semiconductor layer 130 subjected to a heat treatment process.

In the graph (a), it may be confirmed that a strong peak is not formed at a certain angle and thus a noise-to-peak ratio is low. In contrast, in the graph (b), a main peak may be recognized in a region where the diffraction angle 2θ is about 150 to about 16°, and the sub-peak may be recognized in a region where the diffraction angle 26 is about 250 to about 26°. In other words, in the graph (b), a strong peak is formed at a certain angle and the noise-to-peak ratio is relatively high, and thus, it may be confirmed that the semiconductor layer 130 subjected to a heat treatment process has high crystallinity. This means that $Bi_2S_3$ constituting the semiconductor layer 130 was in an amorphous state before the heat treatment process, but crystallized after the heat treatment process. As a result, the semiconductor layer 130 having excellent or suitable crystallinity may be secured by utilizing the heat treatment process.

Next, FIG. 9A illustrates a TEM image of the semiconductor layer 130 not subjected to a heat treatment process, and FIG. 9B illustrates a TEM image of the semiconductor layer 130 subjected to a heat treatment process. In other words, the semiconductor layer 130 in FIG. 9A is a sample in which $Bi_2S_3$ is deposited in an amorphous state, and the semiconductor layer 130 in FIG. 9B is a sample in which $Bi_2S_3$ is converted to a crystalline state.

FIGS. 9A and 9B each illustrate cross-sectional images showing a stacked structure in which the gate insulating layer 120 (see, e.g., FIG. 2), the semiconductor layer 130 (see, e.g., FIG. 2), and the source electrode 160 (see, e.g., FIG. 2) are stacked. In FIG. 9A, an image (a-2) is an enlarged image of a portion of an image (a-1), and an image (a-3) is an enlarged image of a portion of the image (a-2). Similarly, in FIG. 9B, an image (b-2) is an enlarged image of a portion of an image (b-1), and an image (b-3) is an enlarged image of a portion of the image (b-2).

Comparing the image (a-2) of FIG. 9A with the image (b-2) of FIG. 9B, it may be confirmed that the semiconductor layer 130 in FIG. 9B has a layered structure. The layered structure may be formed as $Bi_2S_3$ of the semiconductor layer 130 is crystallized and arranged in a regular pattern. In other words, the semiconductor layer 130 including the crystallized metal chalcogenide may have a structure in which a first sub-layer and a second sub-layer are alternately stacked. In this case, the first sub-layer may refer to a layer, which appears bright, of the layered structure of the semiconductor layer 130 in the image (b-2), and the second sub-layer may refer to a layer, which appears dark, of the layered structure of the semiconductor layer 130 in the image (b-2). The first sub-layer may be a layer in which transition metal elements of the crystallized metal chalcogenide are arranged, and the second sub-layer may be a layer in which chalcogen elements of the crystallized metal chalcogenide are arranged. In one or more embodiments, the first sub-layer may be a layer in which Bi, which is a transition metal element of the crystallized $Bi_2S_3$, is arranged, and the second sub-layer may be a layer in which S, which is a chalcogen element of the crystallized $Bi_2S_3$, is arranged. In addition, it may be confirmed through the image (a-3) of FIG. 9A and the image (b-3) of FIG. 9*b* that $Bi_2S_3$ is crystallized after the heat treatment process.

Next, FIG. 10 illustrates a result of analyzing, by an SIMS, a portion of a display device including the semiconductor layer 130 heat-treated at 250° C. Through a sample analysis method utilizing an SIMS, a change in the content (e.g., amount) of a material to be measured in a thickness direction (e.g., a Z-axis direction) of the semiconductor layer 130 may be measured. The X-axis of FIG. 10 represents the depth in a thickness direction of a sample, and the Y-axis of FIG. 10 represents a signal intensity value for the concentration of a material to be measured.

Referring to FIG. 10, a region having a depth of about 0 nm to about 3 nm is a region of the semiconductor layer 130 including $Bi_2S_3$, and a region having a depth of about 3 nm to about 15 nm is a region of the gate insulating layer 120 including $HfO_2$. In this case, in the region of the semiconductor layer 130, it may be confirmed that Bi atoms and S atoms each form a substantially uniform concentration regardless of depth. In other words, because the semiconductor layer 130 is crystallized through a heat treatment process and $Bi_2S_3$ is regularly arranged, the semiconductor layer 130 may have a constant concentration at any depth. As a result, it may be confirmed that the semiconductor layer 130 including crystallized $Bi_2S_3$ may ensure uniformly excellent or suitable semiconductor properties in the entire region.

Figure 11:
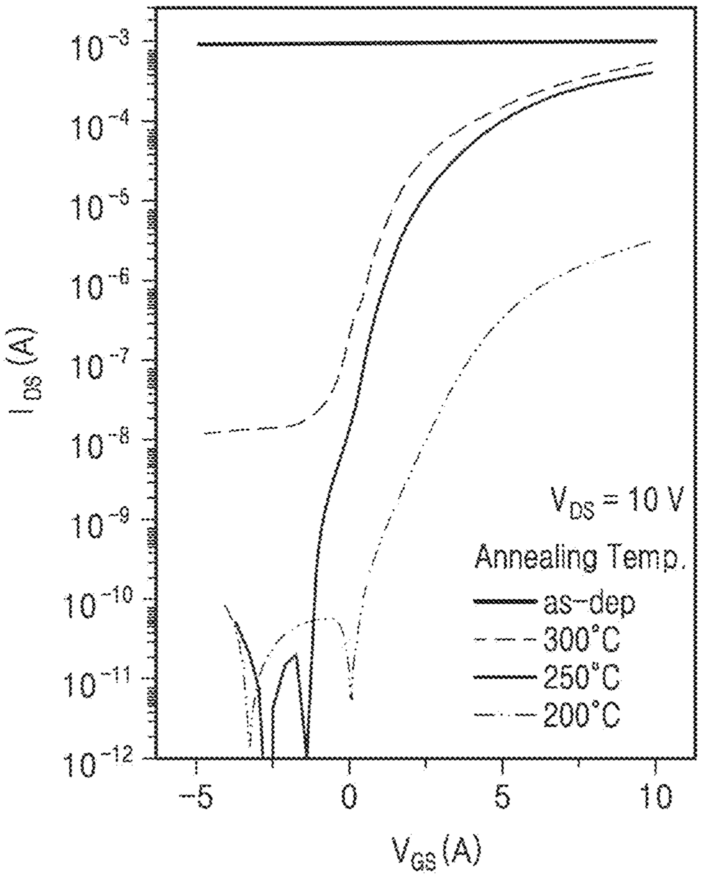
FIG. 11 is a graph showing drain currents $I_{DS}$ according to gate voltages $V_{GS}$ of thin-film transistors according to embodiments of the present disclosure and a comparative example.
Figure 12:
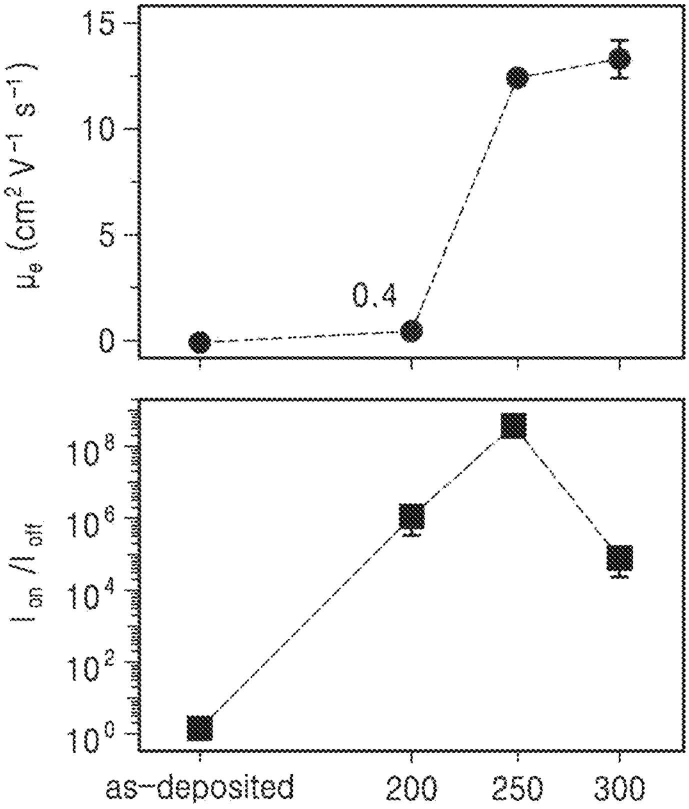
FIG. 12 is graphs showing electron mobility and on-to-off current ratios of thin-film transistors according to embodiments of the present disclosure and a comparative example.
Figure 13:
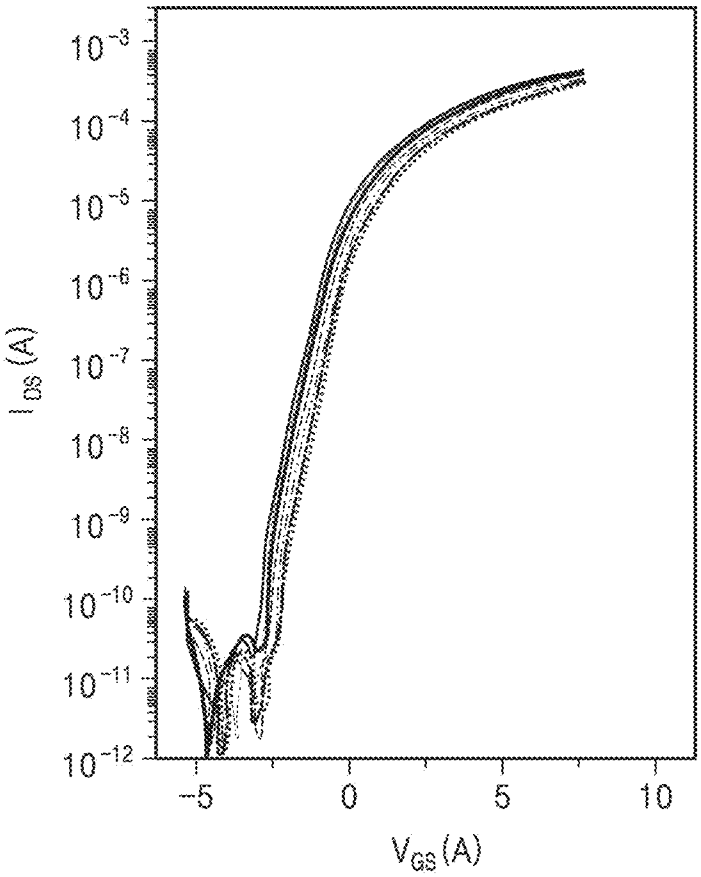
FIG. 13 is a graph showing drain currents $I_{DS}$ according to gate voltages $V_{GS}$ of thin-film transistors according to embodiments of the present disclosure.
Figure 14:
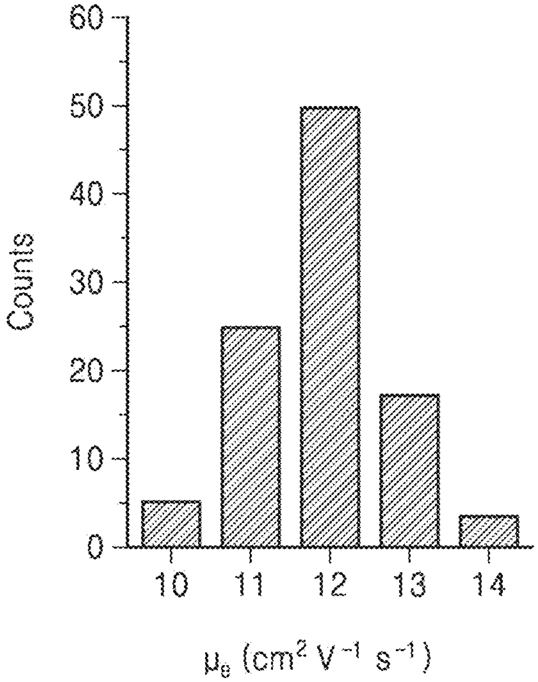
FIG. 14 is a graph showing electron mobility of thin-film transistors according to embodiments of the present disclosure.

FIG. 11 is a graph showing drain currents $I_{DS}$ according to gate voltages $V_{GS}$ of thin-film transistors according to embodiments of the present disclosure and a comparative example, and FIG. 12 is a graph showing electron mobility and on-to-off current ratios of thin-film transistors according to embodiments and a comparative example. FIG. 13 is a graph showing drain currents $I_{DS}$ according to gate voltages $V_{GS}$ of thin-film transistors according to embodiments of the present disclosure, and FIG. 14 is a graph showing electron mobility of thin-film transistors according to embodiments of the present disclosure.

Hereinafter, a thin-film transistor of a display device according to one or more embodiments will be described in more detail by way of examples and a comparative example.

Embodiments 1 to 3: Heat Treatment Process

In Embodiments 1 to 3, after depositing $Bi_2S_3$ on a substrate through a thermal deposition process, crystallization was performed by setting different heat treatment temperatures. In Embodiments 1 to 3, a semiconductor layer including $Bi_2S_3$ is deposited on the substrate by performing a thermal deposition process utilizing Bi metal and $Bi_2S_3$ powder as a thermal deposition source. The thermal deposition process was performed at a temperature of 300° C. and a high vacuum of $3\times10^{-6}$ Torr. In addition, all of the semiconductor layers of Embodiments 1 to 3 are formed to have a thickness of 30 nm.

Thereafter, in Embodiments 1 to 3, a subsequent heat treatment process was performed to crystallize $Bi_2S_3$. However, in Embodiment 1, a subsequent heat treatment process was performed at a temperature of 200° C. for 1 hour, and in Embodiment 2, a subsequent heat treatment process was performed at a temperature of 250° C. for 1 hour. In Embodiment 3, a heat treatment process was performed at a temperature of 300° C. for 1 hour.

In this case, the thin-film transistors of Embodiments 1 to 3 were manufactured in such a way that a gate electrode was formed on a substrate, a gate insulating layer was formed on the gate electrode, a channel layer was formed with each of the semiconductors described above, and then a source electrode and a drain electrode were formed.

Comparative Example 1: No Heat Treatment Process

In Comparative Example 1, as in Embodiments 1 to 3, $Bi_2S_3$ was deposited on a substrate through a thermal deposition process. In Comparative Example 1, a semiconductor layer including $Bi_2S_3$ was deposited on the substrate by performing a thermal deposition process utilizing Bi metal and $Bi_2S_3$ powder as a thermal deposition source. The thermal deposition process was performed at a temperature of 300° C. and a high vacuum of $3\times10^{-6}$ Torr. In addition, the semiconductor layer of Comparative Example 1 was formed to have a thickness of 30 nm. However, in Comparative Example 1, a subsequent heat treatment process was not performed, and $Bi_2S_3$ was maintained in an amorphous state.

In this case, the thin-film transistor of Comparative Example 1 was manufactured in such a way that a gate electrode was formed on a substrate, a gate insulating layer was formed on the gate electrode, a channel layer was formed with each of the semiconductors described above, and then a source electrode and a drain electrode were formed.

FIG. 11 is a graph showing drain currents $I_{DS}$ according to gate voltages $V_{GS}$ of thin-film transistors respectively including semiconductor layers according to Embodiments 1, 2, and 3, and Comparative Example 1. In other words, the graph of FIG. 11 shows transfer characteristics of thin-film transistors to which the semiconductor layers according to Embodiments 1 to 3 and Comparative Example 1 are respectively applied, and the transfer characteristic may correspond to a change in the drain current $I_{DS}$ with respect to the gate voltage $V_{GS}$.

In the case of Comparative Example 1, a constant drain current $I_{DS}$ value of $10^{-3}$ A was detected regardless of an input gate voltage $V_{GS}$ value. Thus, in the case of Comparative Example 1, it may be confirmed that $Bi_2S_3$ is in an amorphous state, has no semiconductor characteristics, and has characteristics as a metal layer.

In contrast, referring to Embodiments 1 to 3, it may be understood that each graph has semiconductor characteristics including a transfer curve. However, the electrical characteristic values of the thin-film transistors of Embodiments 1 to 3 are different from each other. In the case of Embodiment 3, the ON current is about $10^{-4}$ A to about $10^{-3}$ A, the OFF current is about $10^{-8}$ A to about $10^{-7}$ A, and the ON/OFF current ratio is about $10^5$. In the case of Embodiment 2, the ON current is about $10^{-4}$ A to about $10^{-3}$ A, the OFF current is $10^{-10}$ A or less, and the ON/OFF current ratio is as high as $10^8$ or more. In the case of Embodiment 1, the ON current is about $10^{-7}$ to about $10^{-6}$ A, the OFF current is $10^{-10}$ A or less, and the ON/OFF current ratio is about $5\times10^4$.

Thus, it may be understood that the thin-film transistors according to Embodiments 1 to 3 exhibit a low OFF current and a high ON/OFF current ratio and satisfy characteristics as transistors. In particular, it may be understood that, in contrast to the case of Embodiment 1 in which the heat treatment process was performed at 200° C. and Embodiment 3 in which the heat treatment process was performed at 300° C., the thin-film transistor according to Embodiment 2 in which the heat treatment process was performed at 250° C. has the largest slope between ON/OFF states. This means that the thin film transistor of Embodiment 2 in which the heat treatment process was performed at 250° C. has the smallest subthreshold swing value and the greatest effect of improving ON/OFF switching characteristics.

A small subthreshold swing value corresponds to a large subthreshold slope. The subthreshold swing value of Embodiment 1 may be calculated to be 3 V/dec, the subthreshold swing value of Embodiment 2 may be calculated to be 0.2 V/dec, and the subthreshold swing value of Embodiment 3 may be calculated to be 3.5 V/dec. In other words, it may be confirmed that the thin-film transistor of Embodiment 2, in which the heat treatment process was performed at 250° C., has better electrical characteristics than those of Embodiments 1 and 3.

In conclusion, through the results of Embodiments and Comparative Example, in all the case of heat treatment at 200° C., 250° C., and 300° C., $Bi_2S_3$ may be crystalized to secure semiconductor characteristics. However, it may be confirmed that the performance of the thin film transistor may be most effectively improved when the heat treatment process is performed at a level of 250° C.

FIG. 12 is a graph comparing electron mobility $\mu_e$ and on-to-off current ratio ($I_{on}/I_{off}$) values in the thin-film transistors to which the semiconductor layers according to Embodiments 1 to 3 and Comparative Example 1 are respectively applied.

In the case of Comparative Example 1, because the electron mobility $\mu_e$ has a value close to 0 $cm^2$/Vs and the on-to-off current ratio ($I_{on}/I_{off}$) has a low value close to $10^0$, the semiconductor layer according to Comparative Example 1 may not function as a semiconductor layer. In other words, it may be confirmed that a thin-film transistor utilizing $Bi_2S_3$ not subjected to a heat treatment process as a semiconductor may not obtain on-off current modulation according to the application of a gate voltage.

In the case of Embodiment 1, the electron mobility $\mu_e$ has a low value close to 0.4 $cm^2$/Vs, and the on-to-off current ratio ($I_{on}/I_{off}$) has a value of about $10^5$. In other words, a thin-film transistor utilizing $Bi_2S_3$ subjected to a heat treatment process at 200° C. as a semiconductor layer may obtain an on-off current according to the application of a gate voltage, but has low electron mobility.

In the case of Embodiment 2, the electron mobility $\mu_e$ has a high value close to 12.5 $cm^2$/Vs, and the on-to-off current ratio ($I_{on}/I_{off}$) has a value of about $2\times10^8$. In other words, a thin-film transistor utilizing $Bi_2S_3$ subjected to a heat treatment process at 250° C. as a semiconductor layer may secure both (e.g., simultaneously) excellent or suitable electron mobility and an excellent or suitable on-to-off current ratio.

In the case of Embodiment 3, the electron mobility $\mu_e$ has a high value close to 13 $cm^2$/Vs, and the on-to-off current ratio ($I_{on}/I_{off}$) has a value of about $5\times10^4$. In other words, a thin-film transistor utilizing $Bi_2S_3$ subjected to a heat treatment process at 300° C. as a semiconductor layer may have excellent or suitable electron mobility, but have a relatively low on-to-off current ratio.

As a result, it may be confirm from FIG. 12 that the performance of the thin-film transistor may be most effectively improved when the heat treatment process is performed at a temperature of 250° C.

FIG. 13 is a graph showing drain currents $I_{DS}$ according to gate voltages $V_{GS}$ of a plurality of thin-film transistors to which the semiconductor layer according to Embodiment 2 is applied.

Referring to FIG. 13, it may be understood that all of the thin-film transistors utilizing a semiconductor layer subjected to a heat treatment process at 250° C. have a similar slope between on/off states. From this, it may be confirmed that, when the semiconductor layer subjected to the heat treatment process at 250° C. is applied, the thin-film transistor may secure uniformly excellent or suitable electrical characteristics.

In addition, FIG. 14 is a graph showing electron mobility $\mu_e$ of a plurality of thin-film transistors to which the semiconductor layer according to Embodiment 2 is applied, as in FIG. 13.

Referring to FIG. 14, it may be understood that all of the thin-film transistors, to which a semiconductor layer subjected to a heat treatment process at 250° C. is applied, have electron mobility values of about 10 $cm^2/Vs$ to about 14 $cm^2/Vs$. From this, it may be confirmed that, when a semiconductor layer subjected to a heat treatment process at 250° C. is applied, the thin-film transistor may secure uniformly excellent or suitable electron mobility characteristics.

Figure 15:
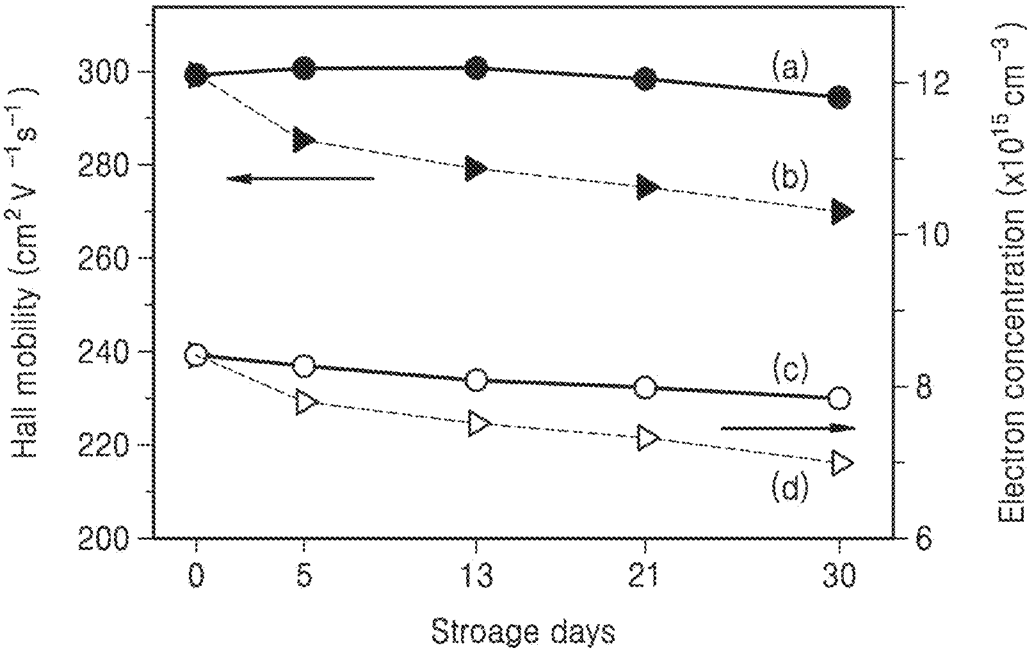
FIG. 15 is a graph showing air stability of a thin-film transistor according to embodiments of the present disclosure.

FIG. 15 is a graph illustrating air stability of a thin-film transistor according to one or more embodiments of the present disclosure.

The thin-film transistor of FIG. 15 is a sample obtained by depositing $Bi_2S_3$ as a semiconductor layer through a thermal deposition process and crystallizing the semiconductor layer through a heat treatment process at 250° C. After manufacturing the thin-film transistor according to the above information, the thin-film transistor was placed in dry air and humid air, and hole mobility and electron concentration were measured according to inspection date.

Referring to FIG. 15, the thin-film transistor according to one or more embodiments maintained almost constant values of hole mobility and electron concentration up to 30 days in dry air. In addition, in the thin-film transistor according to one or more embodiments, the hole mobility decreased only slightly from 300 $cm^2/Vs$ to 270 $cm^2/Vs$ for 30 days even under humid air conditions, and the electron concentration also decreased only slightly from $240\times10^{15}$ $cm^{-3}$ to $220\times10^{15}$ $cm^{-3}$ for 30 days. As a result, it may be confirmed that the thin-film transistor according to one or more embodiments may not only have improved electrical characteristics, but also may secure excellent or suitable stability in air.

Figure 16:
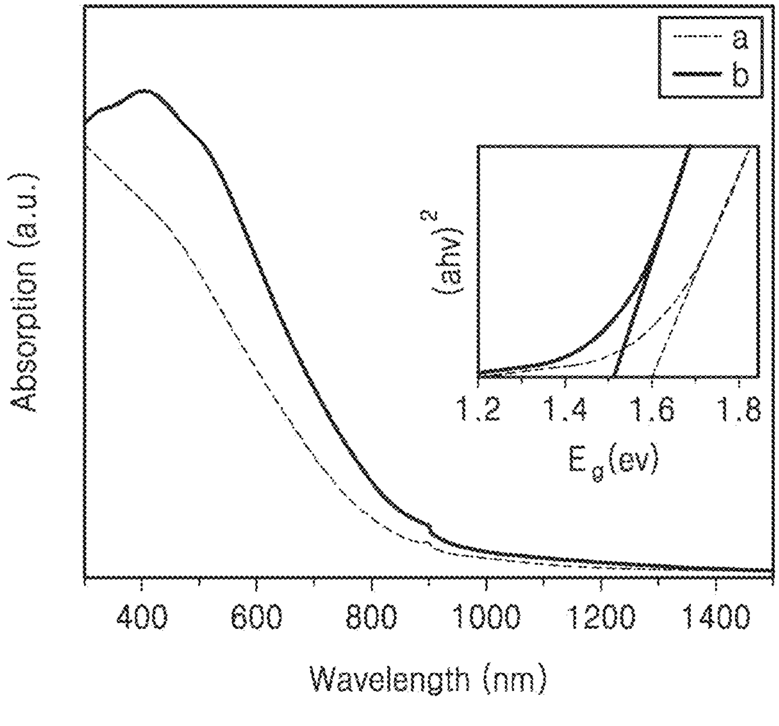
FIG. 16 is a graph showing absorbance of a metal chalcogenide thin film according to embodiments of the present disclosure.
Figure 17:
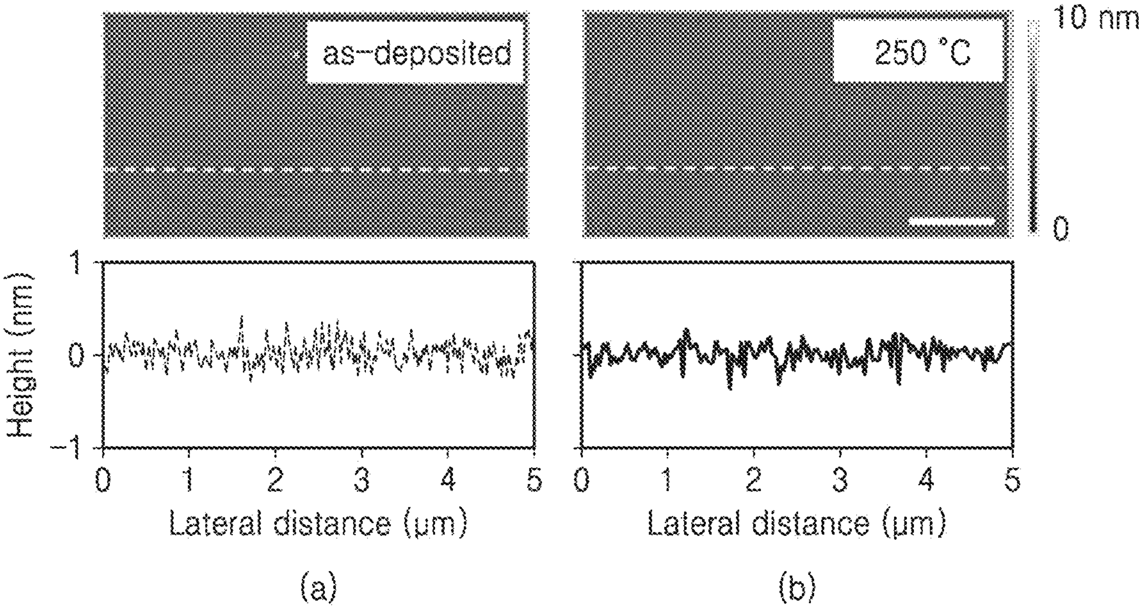
FIG. 17 is images and graphs showing surface roughness of a metal chalcogenide thin film according to one or more embodiments of the present disclosure.

FIG. 16 is a graph showing absorbance of a semiconductor layer of a display device according to one or more embodiments of the present disclosure, and FIG. 17 is images and graphs showing surface roughness of a semiconductor layer of a display device according to one or more embodiments of the present disclosure.

FIG. 16 is a graph showing the absorbance of the semiconductor layer according to the wavelength of light. Using measured absorbance, the band gap energy of the semiconductor layer may be calculated through a tauc plot. In the tauc plot, a is the absorption coefficient and the X-axis corresponds to energy. The tauc plot includes a curved section with an inflection point and a linear section, and a band gap energy may be derived from a point where a straight line extending from the linear section of the tauc plot intersects an energy axis.

Referring to FIG. 16, a graph (a) shows an XPS analysis result for the semiconductor layer 130 not subjected to a heat treatment process, and a graph (b) shows an XPS analysis result for the semiconductor layer 130 subjected to a heat treatment process. Specifically, a sample in the graph (a) is in an amorphous state because $Bi_2S_3$ is deposited and a subsequent heat treatment process is not performed, and a sample in the graph (b) is in a crystalline state because $Bi_2S_3$ is deposited and a subsequent heat treatment process is performed.

A band gap energy of the semiconductor layer not subjected to the heat treatment process, calculated utilizing the tauc plot based on the absorbance of the graph (a), is about 1.6 eV, and a band gap energy of the semiconductor layer subjected to the heat treatment process, calculated utilizing the tauc plot based on the absorbance of the graph (b), is about 1.5 eV. In other words, the semiconductor layer including $Bi_2S_3$ has no significant difference in band gap before and after heat treatment. Accordingly, the fact that electrical characteristics of the thin-film transistor are improved by applying $Bi_2S_3$ crystallized through the heat treatment process as a semiconductor layer confirms that device characteristics are not affected by a difference in bandgap.

FIG. 17 is images and graphs showing the roughness (RMS) of the semiconductor layer 130, deposited with $Bi_2S_3$, before and after heat treatment.

The semiconductor layer 130 including $Bi_2S_3$ in an amorphous state before heat treatment has a surface roughness value of about 0.28 nm. The semiconductor layer 130 including $Bi_2S_3$ in a crystalline state after heat treatment has a surface roughness value of about 0.24 nm. Both the surface roughness value of the semiconductor layer 130 not subjected to the heat treatment process and the surface roughness value of the semiconductor layer 130 subjected to the heat treatment process are at good or suitable levels. However, it may be confirmed that, when the semiconductor layer 130 including $Bi_2S_3$ is crystallized utilizing a heat treatment process, the surface roughness of the semiconductor layer 130 is slightly improved from 0.28 nm to 0.24 nm. In other words, as the surface roughness of the semiconductor layer 130 is improved through the heat treatment process, not only device characteristics may be improved, but also damages due to defects at a stack interface may be prevented or reduced and reliability may also be improved.

The thin-film transistor according to one or more embodiments made as described above may have improved electrical characteristics by securing excellent or suitable electron mobility and an excellent or suitable current on/off ratio. The above effects are examples, and the scope of the disclosure is not limited by the effects.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

As used herein, "/" may be interpreted as "and", or as "or" depending on the context.

As used herein, the term "substantially," "about," and similar terms are used as terms of approximation and not as terms of degree, and are intended to account for the inherent deviations in measured or calculated values that would be recognized by those of ordinary skill in the art. "Substantially" as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "substantially" may mean within one or more standard deviations, or within ±30%, 20%, 10%, 5% of the stated value.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Further, the use of "may" when describing embodiments of the present disclosure refers to "one or more embodiments of the present disclosure."

The light emitting device, electronic apparatus or any other relevant devices or components according to embodiments of the present disclosure described herein may be implemented utilizing any suitable hardware, firmware (e.g., an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random-access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by those of ordinary skill in the art that one or more suitable changes and modifications in form and details may be made without departing from the spirit and scope as defined by the following claims and equivalents thereof.

What is claimed is:

1. A display device comprising:

a substrate;

a thin-film transistor on the substrate; and a light-emitting diode electrically connected to the thin-film transistor, wherein the thin-film transistor comprises:

a semiconductor layer in which a source region, a drain region, and a channel region are defined;

a gate electrode insulated from the semiconductor layer and overlapping the semiconductor layer;

a source electrode electrically connected to the source region; and a drain electrode electrically connected to the drain region, wherein the semiconductor layer comprises a crystallized metal chalcogenide comprising a transition metal and a chalcogen element, and the semiconductor layer has a layered structure;

wherein the layered structure of the semiconductor layer has a structure in which a first sub-layer and a second sub-layer are alternately stacked; and wherein the transition metal of the crystallized metal chalcogenide is arranged in the first sub-layer, and the chalcogen element of the crystallized metal chalcogenide is arranged in the second sub-layer.

2. The display device of claim 1, wherein, in the crystallized metal chalcogenide, a main peak obtained by an X-ray diffraction (XRD) spectrum is in a region where a diffraction angle 2θ is about 15° to about 16°, and a sub-peak obtained by the X-ray diffraction (XRD) spectrum is in a region where the diffraction angle 2θ is about 25° to about 26°.

3. The display device of claim 1, wherein the semiconductor layer has a thickness of about 10 nm to about 50 nm.

4. The display device of claim 1, wherein electron mobility of the thin-film transistor comprising the semiconductor layer has a value of about 10 $cm^2V^{-1}s^{-1}$ to about 14 $cm^2V^{-1}s^{-1}$.

5. The display device of claim 1, wherein an on-to-off current ratio of the thin-film transistor comprising the semiconductor layer has a value of about $10^4$ to about $10^9$.

6. The display device of claim 1, wherein the semiconductor layer has a band gap of about 1.4 eV to about 1.6 eV.

7. The display device of claim 1, wherein the semiconductor layer has a surface roughness of about 0.23 nm to about 0.25 nm.

8. A method of manufacturing the display device of claim 1, the method comprising:

forming the thin-film transistor on the substrate; and forming the light-emitting diode electrically connected to the thin-film transistor, wherein the forming of the thin-film transistor comprises:

forming the semiconductor layer in which the source region, the drain region, and the channel region are defined;

forming the gate electrode insulated from the semiconductor layer and overlapping the semiconductor layer;

forming the source electrode electrically connected to the source region; and forming the drain electrode electrically connected to the drain region, wherein the forming of the semiconductor layer comprises:

depositing a semiconductor precursor comprising a metal chalcogenide, which comprises the transition metal and the chalcogen element; and crystallizing the semiconductor precursor to have the layered structure.

9. The method of claim 8, wherein the metal chalcogenide is a compound of the transition metal and the chalcogen element, and wherein the transition metal comprises at least one of bismuth (Bi), tin (Sn), niobium (Nb), tantalum (Ta), molybdenum (Mo), tungsten (W), hafnium (Hf), titanium (Ti), or rhenium (Re), and the chalcogen element comprises at least one of sulfur(S), selenium (Se), or tellurium (Te).

10. The method of claim 9, wherein the semiconductor layer having the layered structure comprises bismuth sulfide ($Bi_2S_3$).

11. The method of claim 8, wherein the depositing of the semiconductor precursor is performed through a thermal deposition process.

12. The method of claim 11, wherein the thermal deposition process comprises:

providing a thermal deposition source and the substrate into a vacuum chamber;

heating the thermal deposition source; and evaporating a material included in the thermal deposition source, in an atomic or molecular state, and depositing the material on a surface of the substrate to coat the surface of the substrate with a thin film.

13. The method of claim 12, wherein the thermal deposition source comprises Bi metal and $Bi_2S_3$ powder.

14. The method of claim 12, wherein, in the thermal deposition process, an inside of the vacuum chamber is heated to and then maintained at about 150° C. to about 450° C.

15. The method of claim 8, wherein the semiconductor layer has a thickness of about 10 nm to about 50 nm.

16. The method of claim 8, wherein the crystallizing of the semiconductor precursor is performed through a heat treatment process.

17. The method of claim 16, wherein the heat treatment process comprises applying heat of about 200° C. to about 300° C. for about 30 minutes to about 1 hour.

18. The method of claim 8, wherein, through the crystallizing of the semiconductor precursor, electron mobility of the thin-film transistor has a value of about 10 $cm^2V^{-1}s^{-1}$ to about 14 $cm^2V^{-1}s^{-1}$.

19. The method of claim 8, wherein, through the crystallizing of the semiconductor precursor, an on-to-off current ratio of the thin-film transistor has a value of about $10^4$ to about $10^9$.

20. The display device of claim 1, wherein the first and second sub-layers are substantially parallel to the substrate.

21. The display device of claim 1, wherein the transition metal comprises at least one of bismuth (Bi), tin (Sn), niobium (Nb), tantalum (Ta), molybdenum (Mo), tungsten (W), hafnium (Hf), titanium (Ti), or rhenium (Re), and the chalcogen element comprises at least one of sulfur(S), selenium (Se), or tellurium (Te).

22. The display device of claim 21, wherein the semiconductor layer comprises bismuth sulfide ($Bi_2S_3$).

* * * * *